United States Patent [19]
Kiriaki

[11] Patent Number: 6,140,842
[45] Date of Patent: Oct. 31, 2000

[54] DIFFERENTIAL, HIGH SPEED, ECL TO CMOS CONVERTER

[75] Inventor: Sami Kiriaki, Garland, Tex.

[73] Assignee: Texas Instruments Incorporated, Dallas, Tex.

[21] Appl. No.: 09/123,208

[22] Filed: Jul. 27, 1998

[51] Int. Cl.[7] .................... H03K 19/0175; H03K 19/086
[52] U.S. Cl. .................. 326/66; 326/66; 326/77; 326/84; 326/126; 326/127
[58] Field of Search .................. 326/66, 77, 84, 326/126, 127

[56] References Cited

U.S. PATENT DOCUMENTS 5,059,829  10/1991  Flannagan et al. ...................... 307/475

*Primary Examiner*—Michael Tokar
*Assistant Examiner*—Thanh-Tam Le
*Attorney, Agent, or Firm*—Lawrence J. Bassuk; Frederick J. Telecky

[57] ABSTRACT

This invention relates to interfacing high speed, low voltage, data streams with CMOS circuits and, more specifically, to converting low voltage, differential, ECL signal levels to higher voltage levels which are compatible with CMOS circuits while maintaining high speed and sufficient drive capability for larger system applications. This is accomplished primarily by making the first stage inverters 5 and 6 as geometrically small as possible and providing additional cross-coupled buffers 7 and 8 capable of driving large capacitive loads.

6 Claims, 2 Drawing Sheets

DIFFERENTIAL, HIGH SPEED, ECL TO CMOS CONVERTER

BACKGROUND OF THE INVENTION

1. Cross-Reference to Related Application

This invention is related to the invention disclosed and claimed in co-pending U.S. Patent Application, filed of even date with the filing date of this Application and bearing Attorney's Docket No. TI-21557, the contents of which are hereby incorporated by reference in this Application.

2. Field of the Invention

This invention relates to the interfacing of high speed, low voltage, data streams with CMOS circuits and, more specifically, to converting low voltage, differential, ECL signal levels to higher voltage levels which are compatible with CMOS circuits while maintaining high speed and sufficient drive capability.

3. Brief Description of the Prior Art

Differential Emitter Coupled Logic (ECL) circuitry is often used in high speed data transmission applications due to its small signal nature and resulting higher speed of operation. The differential aspect of these low level signals provides improved signal-to-noise, due to common mode operation at the receiving end of the transmission. However, it is important that these low level ECL signals be converted to higher levels without a significant degradation in speed and that the output of the converter has sufficient drive capability to make it useful for a particular application.

Existing circuits of this type often make the ECL to CMOS level conversion at the expense of speed and/or drive capability. Inherently, the lower ECL levels can be switched faster than the larger CMOS levels, but attempts to speed up the conversion process often diminish the output drive capability of the circuit. Representative prior circuits of this general type are shown in U.S. Pat. No. 5,726,588 to Fiedler, U.S. Pat. No. 5,606,268 to Van Brunt and U.S. Pat. No. 5,426,381 to Flannagan et al. None of these patents discloses or suggests the novel features of the present invention..

SUMMARY OF THE INVENTION

This invention addresses the conversion of small ECL level signals to CMOS level (typically 5 volt or greater) signals with the highest possible speed and drive capability. The basic approach in the invention is to keep the circuitry simple with as few parts as possible, since generally, the fewer the number of parts, the faster the circuit will be.

Briefly, a differential pre-amplifier with constant current source is used to dynamically sink and source current in the two legs of the amplifier based on the ECL signal levels at the input of the amplifier. In order to achieve the highest possible speed, the load capacitance at the output of the differential pre-amplifier is kept as small as possible. This is accomplished by designing the first stage inverters or other form of buffers, which are driven by the differential pre-amplifier, with the smallest possible geometries on the integrated circuit;. Drive capability is then provided by means of an additional buffer which may take the form of an inverter. Drive capability for large capacitive loads is then provided by means of additional buffers at the outputs of the circuit.

In the preferred embodiment, a provision for driving higher loading conditions such as may be found in systems applications is included. The achievement of this level of drive capability often involves multiple buffering and complexity in the circuitry which in turn causes a degradation in speed. To overcome this, a cross-coupled emitter follower is used to address both the speed and drive capability requirements. The normal load resistors in these cross-coupled emitter followers are replaced by N-channel MOSFETs. The emitter followers are designed with higher load capability through the expedient of driving the gates of these MOSFET loads from the complementary cross-coupled signal to help speed up the response of the output signal. If, for example, the output of the emitter follower is to go high, the load MOSFET is assisted in turning off at a faster rate by this cross-coupling. The minimization of the capacitive loading on the differential pre-amplifier and the provision of larger geometry bipolar emitter followers with complementary feedback to provide necessary drive capability for large capacitive loads results in a uniquely fast and powerful converter.

DESCRIPTION OF THE PREFERRED EMBODIMENT

Figure 1:
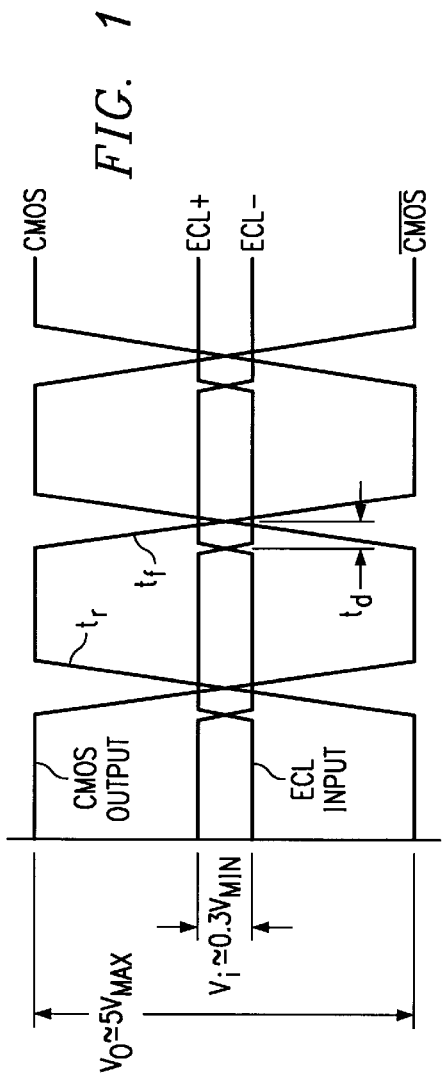
FIG. 1 illustrates the ECL to CMOS levels involved in the conversion.

FIG. 1 illustrates the ECL to CMOS conversion process. As shown, at the present state of the art, the differential ECL input pulse $V_i$ can have an amplitude as low as 0.3 volts while the resulting complementary CMOS output pulse $V_o$ can be as large as 5 volts or greater. In FIG. 1, $t_d$ indicates the delay time between the ECL input and CMOS output pulses while $t_r$ and $t_f$ represent the rise and fall times of the CMOS output pulse. The goal of the circuit is to keep these parameters as small as possible in order to maintain high speed operation.

Figure 2:
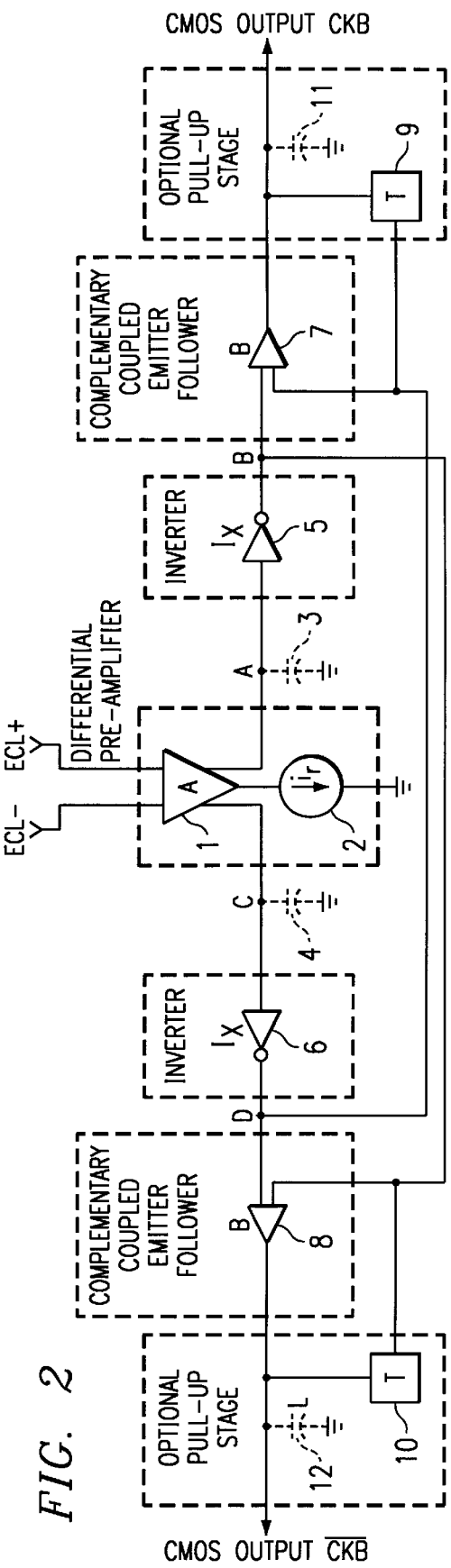
FIG. 2 shows a block diagram for the ECL to CMOS converter.

FIG. 2 is a block diagram of the preferred embodiment of the invention. In this embodiment, the differential pre-amplifier consists of a basic differential amplifier 1 and a constant current source 2. Complementary ECL inputs ECL− and ECL+ are coupled to the inputs of the differential pre-amplifier. The differential outputs of the pre-amplifier drive circuit nodes A and C. A goal of the circuit design is to maintain the capacitance at these two nodes, shown as phantom capacitors 3 and 4 respectively, as low as possible. The outputs of the differential pre-amplifier drive inverters 5 and 6. These inverters are labeled $I_x$, where x indicates minimum geometries for the design rules being used. Keeping these inverters small tends to lower the capacitance at nodes A and C which in turn enhances the speed of the circuit. While inverters are used in the preferred embodiment, it is equally within the contemplation of the invention that non-inverting buffers can be employed as an alternative. This element, whether inverting or not, may alternatively be referred to as an inverter, buffer, buffer stage or intermediate buffer. Although the outputs of inverters 5 and 6 switch between CMOS levels $V_d$ and $V_s$ and have a fast response, their drive capability is limited. For purposes of this description, $V_d$ and $V_s$ are assumed to be five volts and ground, although they are not limited to these values.

To provide the desired drive capability, two buffer circuits 7 and 8 are added. Basically, these buffers are emitter followers with cross-coupled load transistors which are driven from the complementary side of the circuit. nodes D and B, to speed up the switching time of the buffers. The outputs of buffers 7 and 8 are capable of driving larger system type capacitive loads, emulated as phantom capacitors 11 and 12. These are not part of the circuit, but simply represent the larger loading capability at the outputs.

Also shown are optional output pull-up stages 9 and 10 which can be added for those applications requiring that the output swing between the CMOS rails, Vd and $V_s$.

Figure 3:
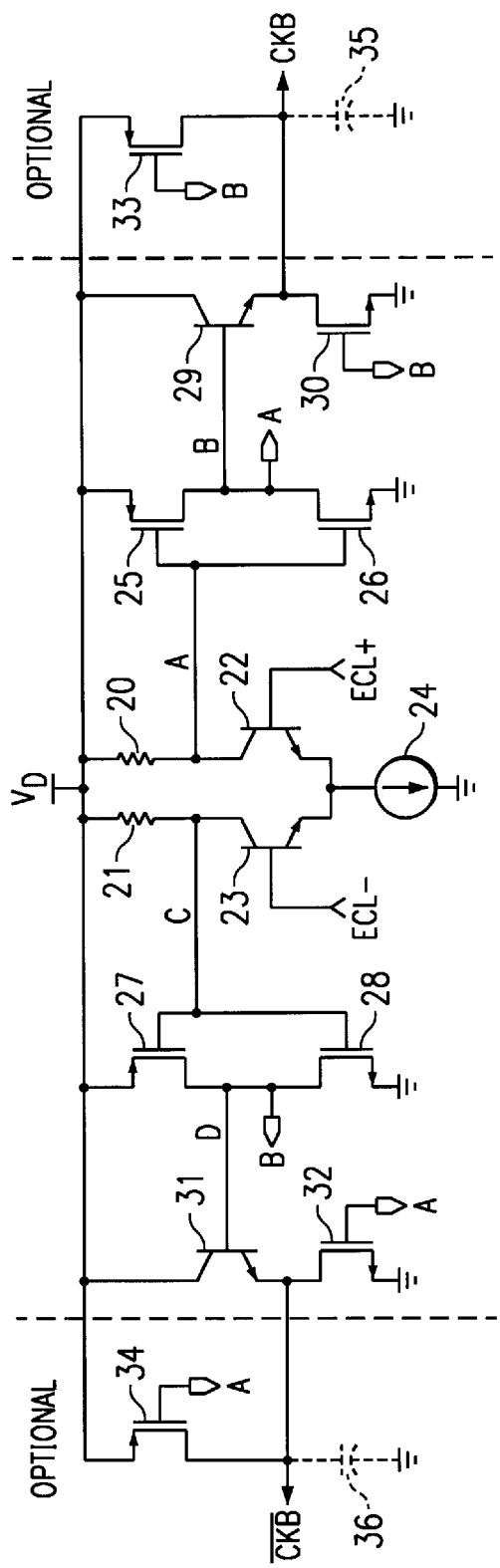
FIG. 3 shows a schematic circuit diagram for the ECL to CMOS converter.

FIG. 3 shows a detailed schematic for an implementation of the circuit. As discussed earlier, the CMOS levels of $V_d$ and $V_s$ may be +5V and ground. Here the differential pre-amplifier consists of transistors 22 and 23 and resistors 20 and 21 along with a constant current source 24. The small differential ECL level inputs signals, labeled ECL+ and ECL−, at the base of transistors 22 and 23, respectively direct the sourcing and sinking of current in the two legs of the amplifier. The outputs of the differential pre-amplifier drive the minimum capacitance at nodes A and C and are the inputs to inverters on each side of the complementary circuit. These inverters are comprised of transistor pairs 25–26 and 27–28. Each inverter includes a p-channel transistor 25 or 27 and an n-channel transistor 26 or 28. These inverters are designed to have the minimum component dimensions possible for the chosen process design rules being used in the design so as to keep the capacitance at nodes A and C low. The output of these inverters, shown at nodes B and D, are at CMOS levels and complementary to the signals from the differential pre-amplifier, i.e., if the ECL+ signal goes high, the amplifier output at node A tends to go low and the inverter output at node B goes high. These first stage inverters, however, have only limited drive capability due to the size of their components.

To provide the desired drive capability, buffer circuits are added at the outputs of the first inverters at nodes B and D. These buffers consist of two bipolar transistors 29 and 31 and two n-channel transistors 30 and 32. These circuits are much like normal emitter followers with the exception that the gates of the two n-channel load transistors are cross-coupled to the corresponding complementary signals from nodes D and B, respectively. This feature is used to speed up the response time of the ECL to CMOS converter. For example, if the output of the buffer 29–30 is going high, the input to the gate of load transistor 30, driven from the output of inverter 27–28 at node D, is going low to help turn off transistor 30 faster and speed up operation of the circuit. As a result, this ECL to CMOS converter can drive the large system level loads, indicated as phantom capacitors 35 and 36 and still operate at relatively high speeds. Since the emitter followers are non-inverting, the complementary output signals will have the same polarity as the outputs of the first inverters at nodes B and D.

Optional p-channel pull-up transistors 33 and 34 can be added for applications which require full complementary CMOS levels which swing between $V_d$ and $V_s$. As shown in FIG. 3, these optional transistors are driven at their gates by the same cross-coupled complementary signals from nodes A and B as used to drive transistors 30 and 32. The operation of these pull-up transistors is illustrated in FIG. 4.

Without the pull-up transistors, when the output of the converter goes high, the signal level will quickly rise and settle at a voltage equal to $V_d - V_{be}$, where $V_{be}$ is the base-to-emitter voltage of bipolar transistors 29 and 31. This is illustrated in FIG. 4 which shows the rise in output voltage when the ECL input voltage changes state. In the ideal waveform shown, the output voltage rises instantaneously to the supply voltage, $V_d$, and remains there until the input again changes state. In the actual circuit, however, the rise in output voltage is rapid but less than instantaneous, and settles at the value $V_d - V_{be}$ as shown in FIG. 4.

Figure 4:
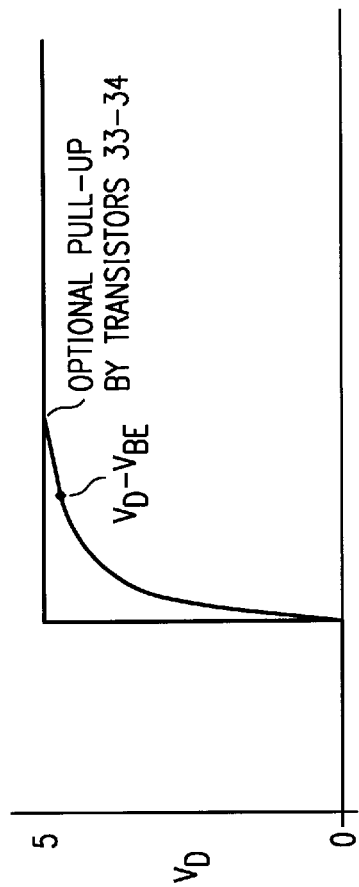
FIG. 4 illustrates the operation for an optional pull-up transistor at the complementary outputs of the circuit to provide rail-to-rail voltage swing.

When pull-up transistors 33 and 34 are added to the circuit, however, the output signals can pull all the way up to $V_d$, although at a slightly slower rate as illustrated in FIG. 4. For example with reference to FIG. 3, if the output of the emitter follower consisting of transistors 29 and 30 is to go high, then the voltage at the gate of transistor 33 will be low. This turns transistor 33 on to pull the output CKB all the way up to the supply voltage, $V_d$.

Thus there is provided a high speed, low cost, ECL to CMOS converter which can drive large capacitance loads found in many system applications.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the inventions.

What is claimed is:

1. Apparatus for converting low level input signals to CMOS level output signals, said apparatus comprising:
   (a) an pre-amplifier coupled to receive said low level input signal,
   (b) an output buffer operatively coupled to receive an output of said pre-amplifier, said output buffer having a first transistor in an emitter follower configuration, with the load of said emitter follower provided by a second transistor,
   (c) a circuit for generating a drive signal, said drive signal serving to turn off said second transistor when the desired output of said emitter follower is a preselected logic level, and
   (d) a second buffer circuit operatively coupling said one output of said pre-amplifier to said output buffer.

2. The apparatus of claim 1 further comprising a third transistor, the input terminal of which is coupled to receive said drive signal, said third transistor connecting the output of said emitter follower to a preselected voltage when the desired output of said emitter follower is said preselected logic level.

3. Apparatus for converting low level input signals to CMOS level signals, said apparatus comprising:
   (a) a pre-amplifier coupled to receive said low level input signals and for producing two output signals, said two output signals being at opposite logic levels,
   (b) first and second output buffers each operatively coupled to receive a different of said two output signals, each of said first and second output buffers having an emitter follower transistor, with the load of said emitter follower transistor provided by a second transistor,
   (c) a circuit for providing different drive signals for each of said second transistors, each said drive signal serving to turn off one of said second transistors when the desired output of the corresponding emitter follower is a preselected logic level, and
   (d) intermediate buffer circuits, the first operatively coupling a first output of said pre-amplifier to said first output buffer and the second operatively coupling a second output of said pre-amplifier to said second output buffer.

4. The apparatus of claim 3 further comprising a pair of third transistors, each of said pair of third transistors being associated with the emitter follower of one of said first and second output buffers and having an input terminal coupled to receive the drive signal for the second transistor of its associated emitter follower, said third transistor connecting the output of its associated emitter follower to a preselected voltage when the desired output of the associated emitter follower is said preselected logic level.

5. A method for converting low level input signals to CMOS level output signals, said methods comprising the steps of:

(a) applying said low level input signals to a pre-amplifier, (b) operatively coupling a first output of said pre-amplifier to an output buffer, said output buffer having a first transistor in an emitter follower configuration, with the load of said emitter follower provided by a second transistor, (c) generating a drive signals, said drive signals serving to turn off said second transistor when the desired output of said emitter follower is a preselected logic level, and (d) applying said first output of said pre-amplifier to an intermediate buffer circuit and applying the output of said buffer circuit to said output buffer.

6. The method of claim 5 comprising the further step of applying said drive signal to a third transistor, said third transistor connecting the output of said emitter follower to a preselected voltage when the desired output of said emitter follower is said preselected logic level.

* * * * *

(12) EX PARTE REEXAMINATION CERTIFICATE (7532nd)
United States Patent
Kiriaki

(10) Number: US 6,140,842 C1
(45) Certificate Issued: May 25, 2010

(54) DIFFERENTIAL, HIGH SPEED, ECL TO CMOS CONVERTER

(75) Inventor: Sami Kiriaki, Garland, TX (US)

(73) Assignee: Texas Instruments Incorporated, Dallas, TX (US)

Reexamination Request:
No. 90/010,292, Sep. 22, 2008

Reexamination Certificate for:
Patent No.: 6,140,842
Issued: Oct. 31, 2000
Appl. No.: 09/123,208
Filed: Jul. 27, 1998

(51) Int. Cl.
*H03K 19/0175* (2006.01)
*H03K 19/086* (2006.01)

(52) U.S. Cl. ............................... 326/66; 326/77; 326/84; 326/126; 326/127

(58) Field of Classification Search ......................... None
See application file for complete search history.

(56) References Cited

PUBLICATIONS

Bonges et al., "A 576K 3.5–ns Access biCMOS ECL Static RAM with Array Built–in Self–Test," IEEE Journal of Solid State Circuits, vol. 27, No. 4, Apr. 1992, USA, pp. 649–655 (Figure 3).
Kertis et al., "A 12–ns ECL I/O 256Kx1–bit SRAM Using a 1–μm BiCMOS Technology," IEEE Journal of Solid State Circuits, vol. 23, No. 5, Oct. 1998, USA, pp. 1048–1053 (Figure 4).

*Primary Examiner*—My-Trang Ton

(57) ABSTRACT

This invention relates to interfacing high speed, low voltage, data streams with CMOS circuits and, more specifically, to converting low voltage, differential, ECL signal levels to higher voltage levels which are compatible with CMOS circuits while maintaining high speed and sufficient drive capability for larger system applications. This is accomplished primarily by making the first stage inverters 5 and 6 as geometrically small as possible and providing additional cross-coupled buffers 7 and 8 capable of driving large capacitive loads.

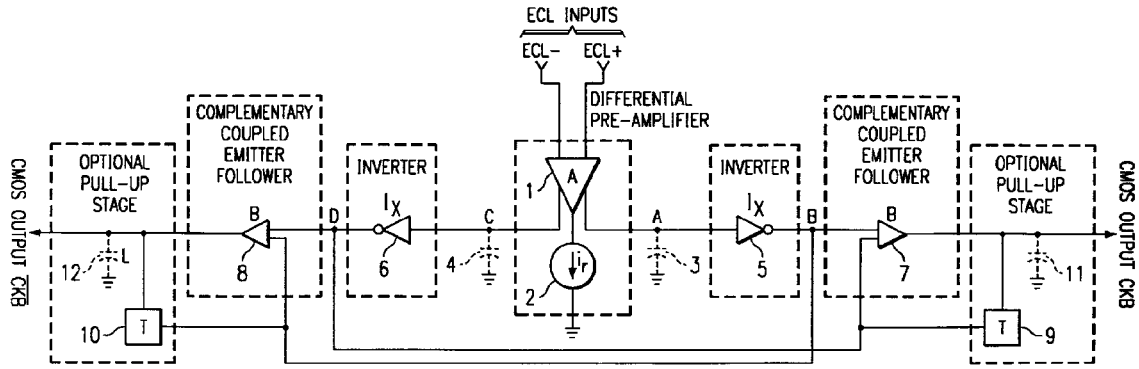

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 3 and 4 are cancelled.

Claims 1 and 5 are determined to be patentable as amended.

New claims 7–27 are added and determined to be patentable.

Claims 2 and 6 were not reexamined.

1. Apparatus for converting low level input signals to CMOS level output signals, said apparatus comprising:
   (a) an pre-amplifier coupled to receive said low level input [signal] *signals, said pre-amplifier for generating a one output signal and another output signal, said one output signal complementary to said another output signal,*
   (b) an output buffer operatively coupled to receive an output of said pre-amplifier, said output buffer having a first transistor in an emitter follower configuration, with the load of said emitter follower provided by a second transistor,
   (c) a circuit for generating a drive signal, said drive signal serving to turn off said second transistor when the desired output of said emitter follower is a preselected logic level, *said circuit for generating comprising at most two transistors, said circuit for generating directly connected to said another output signal, said drive signal directly driving a control terminal of said second transistor,* and
   (d) a second buffer circuit operatively coupling said one output *signal* of said pre-amplifier to said output buffer.

5. A method for converting low level input signals to CMOS level output signals, said methods comprising the steps of:
   (a) applying said low level input signals to a pre-amplifier, *said pre-amplifier generating a first and a second output signal, said first output signal complementary to said second output signal,*
   (b) operatively coupling [a] *said* first output *signal* of said pre-amplifier to an output buffer, said output buffer having a first transistor in an emitter follower configuration, with the load of said emitter follower provided by a second transistor,
   (c) generating a drive [signals] *signal*, said drive [signals] *signal* serving to turn off said second transistor when the desired output of said emitter follower is a preselected logic level, *said generating said drive signal as a result of at most two transistors, said generating said drive signal as a result of a direct connection with said second output signal, said drive signal directly driving a control terminal of said second transistor,* and
   (d) applying said first output *signal* of said pre-amplifier to an intermediate buffer circuit and applying the output of said *intermediate* buffer circuit to said output buffer.

7. *Apparatus for converting low level input signals to CMOS level output signals, said apparatus comprising:*
   *(a) an pre-amplifier coupled to receive said low level input signals,*
   *(b) an output buffer operatively coupled to receive an output of said pre-amplifier, said output buffer having a first transistor in an emitter follower configuration, with the load of said emitter follower provided by a second transistor,*
   *(c) a circuit for generating a drive signal, said drive signal serving to turn off said second transistor when the desired output of said emitter follower is a preselected logic level, said circuit for generating comprising a MOS transistor with a gate directly connected to another output of said pre-amplifier, a drain of said MOS transistor directly connected to a control terminal of said second transistor, and*
   *(d) a second buffer circuit operatively coupling said one output of said pre-amplifier to said output buffer.*

8. *The apparatus of claim 7, said low level input signals having a maximum voltage less than a maximum voltage of said CMOS level output signals, and said low level input signals having a minimum voltage greater than a minimum voltage of said CMOS level output signals.*

9. *The apparatus of claim 7, said low level input signals having a differential voltage less than a differential voltage of said CMOS level output signals.*

10. *The apparatus of claim 7, said CMOS level output signals having a voltage between substantially five volts and substantially ground.*

11. *The apparatus of claim 8, said CMOS level output signals having a voltage between substantially five volts and substantially ground.*

12. *The apparatus of claim 9, said CMOS level output signals having a voltage between substantially five volts and substantially ground.*

13. *The apparatus of claim 1, said circuit for generating inverting said another output signal of said pre-amplifier to generate said drive signal.*

14. *The apparatus of claim 1, said circuit for generating comprising an n-channel CMOS transistor and a p-channel CMOS transistor.*

15. *The apparatus of claim 1, said low level input signals having a maximum voltage less than a maximum voltage of said CMOS level output signals, and said low level input signals having a minimum voltage greater than a minimum voltage of said CMOS level output signals.*

16. *The apparatus of claim 15, said CMOS level output signals having a voltage between substantially five volts and substantially ground.*

17. *The apparatus of claim 1, said low level input signals having a differential voltage less than a differential voltage of said CMOS level output signals.*

18. *The apparatus of claim 17, said CMOS level output signals having a voltage between substantially five volts and substantially ground.*

19. *The apparatus of claim 1, said CMOS level output signals having a voltage between substantially five volts and substantially ground.*

20. *The method of claim 5, said generating inverting said second output signal of said pre-amplifier for generating said drive signal.*

21. The method of claim 5, said at most two transistors comprising an n-channel CMOS transistor and a p-channel CMOS transistor.

22. The method of claim 5, said low level input signals having a maximum voltage less than a maximum voltage of said CMOS level output signals, and said low level input signals having a minimum voltage greater than a minimum voltage of said CMOS level output signals.

23. The apparatus of claim 22, said CMOS level output signals having a voltage between substantially five volts and substantially ground.

24. The method of claim 5, said low level input signals having a differential voltage less than a differential voltage of said CMOS level output signals.

25. The apparatus of claim 24, said CMOS level output signals having a voltage between substantially five volts and substantially ground.

26. The apparatus of claim 5, said CMOS level output signals having a voltage between substantially five volts and substantially ground.

27. Apparatus for converting low level input signals to CMOS level output signals, said apparatus comprising:

(a) a pre-amplifier coupled to receive said low level input signals, said pre-amplifier for generating a first pre-amplifier output signal and a second pre-amplifier output signal, said first pre-amplifier output signal complementary to said second pre-amplifier output singal, (b) a first output buffer operatively responsive to said first pre-amplifier output signal, said first output buffer having a first transistor in an emitter follower configuration, with a load of said first transistor in said emitter follower configuration provided by a second transistor, a second output buffer operatively responsive to said second pre-amplifier output signal, said second output buffer having a third transistor in an emitter follower configuration, with a load of said third transistor in said emitter follower configuration provided by a fourth transistor, (c) a first buffer circuit for generating a first drive signal, said first drive signal serving to turn off said second transistor when a desired output of said first transistor in said emitter follower configuration is a preselected logic level, said first buffer circuit for generating directly connected to said second pre-amplifier output signal, said first buffer circuit for generating inverting said second pre-amplifier output signal to generate said first drive signal, said first drive signal directly driving a control terminal of said second transistor, and (d) a second buffer circuit for generating a second drive signal, said second drive signal serving to turn off said fourth transistor when a desired output of said third transistor in said emitter follower configuration is a preselected logic level, said second buffer circuit for generating directly connected to said first pre-amplifier output signal, said second buffer circuit for generating inverting said first pre-amplifier output signal to generate said second drive signal, said second drive signal directly driving a control terminal of said fourth transistor.

\* \* \* \* \*